United States Patent [19]
Nguyen et al.

[11] Patent Number: 5,737,187
[45] Date of Patent: Apr. 7, 1998

[54] APPARATUS, METHOD AND SYSTEM FOR THERMAL MANAGEMENT OF AN UNPACKAGED SEMICONDUCTOR DEVICE

[75] Inventors: Minh H. Nguyen, Houston; Mark S. Tracy, Tomball, both of Tex.

[73] Assignee: Compaq Computer Corporation, Houston, Tex.

[21] Appl. No.: 703,342

[22] Filed: Aug. 26, 1996

[51] Int. Cl.⁶ .................................................. H05K 7/20
[52] U.S. Cl. .................... 361/704; 165/80.2; 165/185; 174/16.3; 257/707; 257/713; 257/719; 361/707; 361/710; 361/717; 361/687
[58] Field of Search .................... 165/80.2, 80.3, 165/185; 174/16.3; 257/706–707, 712–713, 718–719, 726–727; 361/687, 704–721

[56] References Cited

U.S. PATENT DOCUMENTS

| | | | |
|---|---|---|---|
| 4,756,081 | 7/1988 | Penn | 361/706 |
| 5,272,599 | 12/1993 | Koenen | 257/707 |
| 5,557,500 | 9/1996 | Baucom et al. | 361/687 |
| 5,559,675 | 9/1996 | Hsieh et al. | 361/707 |
| 5,581,443 | 12/1996 | Nakamura et al. | 361/687 |
| 5,590,026 | 12/1996 | Warren et al. | 361/719 |
| 5,619,399 | 4/1997 | Mok | 361/707 |

*Primary Examiner*—Gregory D. Thompson
*Attorney, Agent, or Firm*—Katz & Cotton, LLP

[57] ABSTRACT

A thermal management structure to provide mechanical isolation and heat removal for a unpackaged semiconductor die mounted directly on a printed circuit board substrate. The thermal management structure sandwiches the unpackaged semiconductor die and substrate between two heat sink pieces which are rigidly mounted to the substrate, thereby mechanically isolating the unpackaged semiconductor die and preventing the die from being accidentally touched. The two heat sink pieces further compliantly thermally engage selected sites on the exposed face of the semiconductor die and the surface of the substrate to conductively remove heat away from the substrate. The thermal management structure may also thermally engage selected thermally conductive components within an end product to spread the heat more uniformly throughout the system.

41 Claims, 8 Drawing Sheets

APPARATUS, METHOD AND SYSTEM FOR THERMAL MANAGEMENT OF AN UNPACKAGED SEMICONDUCTOR DEVICE

BACKGROUND OF THE INVENTION

1. Field of the Invention

The present invention relates generally to an apparatus, method and system for thermal management of a semiconductor device, and, more particularly, to an apparatus, method and system for mechanical isolation combined with removal and dissipation of heat generated by a high clock frequency, high circuit density unpackaged chip-on-board semiconductor device.

2. Description of the Related Technology

Ever increasing market pressure for smaller, faster, and more sophisticated end products using integrated circuits has driven the electronics industry to develop integrated circuits which occupy less volume yet operate at heretofore unheard of clock frequencies employing incredible circuit densities. For example, a current production integrated circuit which serves as a microprocessor is manufactured by the Intel Corporation called the PENTIUM (PENTIUM is the registered trademark of the Intel Corporation). The PENTIUM has over 3 million circuits in a single semiconductor die using 0.6 to 0.35 micron technology, operates at speeds ranging from 75 MHz to 200 MHz, and is projected to soon exceed 200 MHz.

Because of the fragility of integrated circuit dice, and their susceptibility to environmental influences and mechanical trauma, individual or multiple integrated circuit dice have traditionally been enclosed in a protective "package" such as Pin Grid Array ("PGA") or Ball Grid Array ("BGA"). These packages may be made of plastic or ceramic materials, and provide electrical leads so that the enclosed die (or dice) may be electrically connected to a substrate, such as a printed circuit board ("PCB").

As the end products which utilize these increasingly powerful integrated circuits continue to shrink in size, such as laptop computers and other consumer, commercial, and military electronics, the space available for mounting the packaged integrated circuit die (or dice) is also reduced. Unfortunately, as integrated circuits grow in complexity and circuit density, the number of package leads needed to connect the packaged die (or dice) to the substrate also increases, thereby requiring more, not less, area to provide reliable electrical interconnections between the surface mount package to the substrate. Further, as the number of package leads increases, so does the capacitance, inductance and resistance of the package leads, which can degrade signal fidelity to and from the die (or dice).

In an effort to eliminate the above problems associated with modern packaging, some integrated circuit manufacturers have eliminated packages, and placed the unpackaged integrated circuit die (or dice) directly on the substrate. This practice of connecting unpackaged die (or dice) directly on a substrate is generically referred to as "chip-on-board" packaging.

An example of chip-on-board technology which is currently being manufactured and sold is the Intel Corporation's TCP PENTIUM®. The TCP PENTIUM ("TCP" stands for Tape Carrier Packaging) is a version of the PENTIUM in which the microprocessor integrated circuit die is an unpackaged die mounted face up on a PCB substrate and electrically connected to the PCB substrate using tape automated bonding technology. The PCB substrate also has numerous other integrated circuit packages directly connected to the substrate. When multiple dice are mounted on the same substrate, whether some or all are packaged or unpackaged, the combination is usually referred to as a multi chip module ("MCM").

Chip-on-board die leads may be electrically connected to the substrate face down using solder ball bonding (also known as "flip-chip") or in either a face down or face up arrangement using tape automated bonding ("TAB"). The exposed face of the die (i.e. the face opposite the face directly connected to the substrate) may be covered with a mechanically protective encapsulant.

The move to unpackaged chip-on-board technology has overcome some of the problems associated with higher clock speeds and circuit densities, but as is often the case, a successful solution to one problem often creates one or more new problems which must be addressed. One problem with unpackaged dice is that although advances in passivation allow unpackaged dice to withstand normal environmental influences better, unpackaged dice are still fragile and easily damaged by very minor external mechanical trauma, whether or not the dice are topped with an encapsulent. Although traditional component boards and MCM's (i.e. those having only packaged dice) have always been regarded and treated as delicate, this has usually been due to the risk of static electric discharge during handling which could damage the integrated circuits, not the mere accidental touching of a packaged die on a substrate board. An unpackaged die (or dice) with an encapsulent cap should not be subjected to more than 4.5 kilograms (9.9 pounds) of force on the center of the exposed face. A human hand in the mere act of touching an object, typically can and will exert forces greater than 4.5 kilograms.

Component boards and MCM's are usually fabricated at one location and then transported to either a component assembly location of either the original equipment manufacturer or a third party assembler. Sometimes, the component boards and/or MCM's are sold directly to end users who either need to repair or upgrade existing end products. This presents component manufacturers with the dilemma of shipping factory tested known good boards and MCM's having unpackaged dies, only to experience a higher than acceptable mortality rate in the course of normal shipping, and more often than not, normal handling by third party assemblers or end users.

Another problem with an unpackaged die (or dice) is related to the dissipation of waste heat generated by the die (or dice), also known as thermal management. As clock frequency and circuit density increase and die size decreases, the die power density and resulting production of waste heat also increase. As the quantity of waste heat increases, the effective steady state operating temperature of the die may also increase. If the steady state operating temperature of the die becomes greater than the maximum functional operating temperature of the die, the integrated circuit die may suffer degraded performance and/or experience logic errors. If the steady state operating temperature of the die becomes high enough, the die may become permanently damaged and fail.

In addition to thermal performance degradation and/or damage, another problem of chip-on-board technology associated with increased waste heat is caused by the differences in the thermal coefficients of expansion ("TCE") between the die and the substrate, commonly referred to as TCE mismatch. Integrated circuit dice are composed of silicon whereas most substrates are composed of organic materials.

The TCE of organic substrates are much greater than the TCE of silicon dice, therefore as temperature increases the organic substrates expand more than the silicon dice. Further, in a powered state, unpackaged dice conductively transfer most of their generated waste heat to the substrate. Therefore when an end product containing a chip-on-board die is turned on, the die temperature rises from the ambient temperature to the steady state operating temperature, which also raises the temperature of the organic substrate. Because of the TCE mismatch, the substrate expands more than the chip-on-board die. This condition results in a large mechanical stress being placed on the mechanically fragile die and the electrical connections to the substrate. Repeated power cycling can result in mechanical fatigue and eventual failure of die or the electrical connections, thereby destroying the use and/or value of the end product.

The present accepted solution for thermal management and TCE mismatch of unpackaged dice is to use the substrate, with or without thermal vias at the die attachment site, as a heat sink wherein the waste heat generated by the unpackaged die (or dice) is conductively transferred from the die to the substrate where the heat is both conductively transferred away from the die in the substrate and also convectively and radiantly transferred from the substrate to the ambient environment. If additional thermal enhancements are required, such as an externally attached heat sink, the heat sink is attached to the side of the substrate opposite the side where the unpackaged die is mounted. If an external heat sink is attached to the substrate, this provides an additional conductive path to transfer heat away from the die to the substrate, and then on to the external heat sink, where the heat is radiantly and convectively transferred to the ambient environment. Unfortunately, with the current trend of increasing power densities and consequent increasing waste heat generation of unpackaged die (or dice), these thermal management techniques are limited at best and more likely unacceptably inadequate.

What is needed is a apparatus, method and system to provide the necessary thermal management of high power density unpackaged dice during normal operation and which also protects the unpackaged dice from mechanical trauma during normal transportation, handling, installation, and operation.

SUMMARY OF THE INVENTION

Objects of the Invention

It is therefore an object of the present invention to create an apparatus, method and system to manage heat removal and dissipation from an unpackaged, high speed, high circuit density semiconductor die mounted on a chip-on-board substrate.

Another object of the present invention is to creme an apparatus, method and system to provide mechanical isolation and protection for an unpackaged, high speed, high circuit density semiconductor die mounted on a chip-on-board substrate.

A further object is to create an apparatus, method and system to modularize into a single unit an unpackaged, high speed, high circuit density semiconductor die mounted on a chip-on-board substrate with a mechanically protective thermal management device.

Another object of the present invention is to create an apparatus, method and system to remove and dissipate heat produced by a semiconductor device having at least one unpackaged semiconductor die mounted on a chip-on-board substrate.

Yet another object is to create an apparatus, method and system to provide a single module semiconductor device having one or more unpackaged semiconductor dice on a substrate with improved thermal management in a mechanically protective enclosure which may be shipped, handled, installed in an end product and operated in an end product with minimized chance of mechanical and/or thermal damage of the one or more semiconductor dice.

Yet another object is to create an apparatus, method and system to provide a single module semiconductor device having one or more unpackaged semiconductor dice on a substrate with improved thermal management in a mechanically protective enclosure which may be handled and installed in an end user's existing end product by an original component manufacturer, a third party or an end user to replace or upgrade a damaged or outdated semiconductor device in the end user's existing end product with minimized chance of mechanical damage of the one or more unpackaged semiconductor dice.

An advantage of the present invention is the ability to upgrade an existing end product such as a laptop computer by replacing an existing semiconductor device (not employing the invention) contained within an end product chassis with a higher speed and/or higher circuit density semiconductor device (which employs the invention) having a higher heat output without modifying, or with minimal modification, of the passive or active cooling system of the end product, by conducting the additional heat more uniformly throughout the existing available space within the chassis.

A novel feature of the present invention is the ability to remove and dissipate the heat generated by one or more unpackaged semiconductor dice on a substrate by compliantly engaging the exposed face or faces of the one or more dice with minimal compressive force.

Additional objects, advantages and novel features of the invention will be set forth in part in the description which follows, and in part will become apparent to those skilled in the art upon examination of the following or may be learned by practice of the invention. The objects, advantages and novel features of the invention may be realized and attained by means of the instrumentalities and combinations particularly pointed out in the appended claims.

DISCLOSURE OF THE INVENTION

According to the present invention, the foregoing and other objects, advantages and features are attained by a thermal management structure which sandwiches both sides of a chip-on-board substrate. The thermal management structure provides an unpackaged die (or dice) on the chip-on-board substrate with both a mechanical protective cover and maximum conductive heat transfer interface contacts to a heat sink mass.

The mechanical protective cover aspect of the invention allows the chip-on-board substrate to be shipped, handled, installed, and operated with minimal risk of the unpackaged die (or dice) being physically damaged by an accidentally touching with a human hand, tool, shipping carton, end product component or other foreign object. The maximum conductive heat transfer interface aspect of the invention allows a heat sink mass to be compliantly thermally engaged to both the side of the substrate opposite the side where the unpackaged die is mounted (hereinafter "board side") as well as to the fragile exposed face of the unpackaged die, whether or not the unpackaged die has an encapsulent top (hereinafter "exposed face").

By providing the maximum conductive heat transfer interface with both the exposed face of the unpackaged die and the board side of the substrate, the thermal gradient across the die and the substrate immediately attached to the die is reduced, thereby reducing the ultimate steady state operating temperature of the die and the substrate for a given ambient temperature. By reducing the ultimate steady state operating temperature, the likelihood of thermal performance degradation, damage, or TCE mismatch induced failure of the unpackaged die is considerably reduced.

According to another aspect of the invention, the thermal management structure comprises a heat sink mass having a first heat sink piece and a second heat sink piece. Both heat sink pieces have corresponding offsetting mounting brackets (or tabs) which align with mounting sites in the chip-on-board substrate. The offsetting mounting brackets serve to align and fixedly attach the first and second heat sink pieces with the chip-on-board substrate in a predetermined configuration. The offsetting mounting brackets further act as spacers which define and maintain a predetermined minimum distance between an inside face of the respective heat sink piece with the corresponding side of the chip-on-board substrate and any packaged or unpackaged chips thereon.

Mechanically compliant and thermally conductive interface pads are interposed between the inside face of the respective heat sink piece and selected locations on either the unpackaged die exposed face or the substrate board side. Each interface pad has a predetermined thickness which corresponds to the distance between the inside face of the respective heat sink piece with the corresponding selected location on the unpackaged die exposed face or the substrate board side between which the interface pad is interposed. For any selected location, by judiciously selecting the tolerances and allowances of the interface pad thickness and the offset of the mounting brackets, the interface pad will compliantly conform to surfaces of both the inside face of the heat sink piece and the selected locations on either the unpackaged die exposed face or the substrate board side. This will allow maximum conductive thermal interface contact between the substrate or unpackaged die with the heat sink piece while subjecting the selected location to minimum mechanical loading forces.

According to another aspect of the invention, the first and second heat sink pieces may be shaped and sized to provide heat removal from the chip-on-board substrate via conduction to distant points in the heat sink, and by convection and radiation from the heat sink to the ambient environment, while conforming to the space available in the end product to install the chip-on-board substrate. Either or both of the first and second heat sink pieces may have projections which extend, and/or project out of, the main plane of the heat sink piece to enhance conductive heat removal to distant points. Further, either or both of the heat sink pieces may have extended surfaces, such as pins, fins or the like which increase the surface area to mass ratio of the heat sink piece to enhance passive or forced convective heat removal to the ambient environment.

According to another aspect of the invention, either or both of the first and second heat sink pieces may be designed to further compliantly and/or fixedly thermally engage other components in the end product capable of acting as heat spreaders to further conductively remove heat away from both the heat sink and the chip-on-board substrate. Such heat spreaders may be chassis or case components of the end product, for example a portable computer keyboard assembly, chassis, frame or case.

Other and further objects, advantages and novel features will be apparent from the following description of the presently preferred embodiments of the invention, given for the purpose of disclosure and taken in conjunction with the accompanying drawings.

DETAILED DESCRIPTION OF PREFERRED EMBODIMENTS

A better understanding of the present invention and the preferred embodiments will be obtained when the following detailed description is read with reference to the drawings. Like elements in the drawings are represented by like number, and similar elements are represented by like numbers with a different lower case letter suffix.

Figure 1:
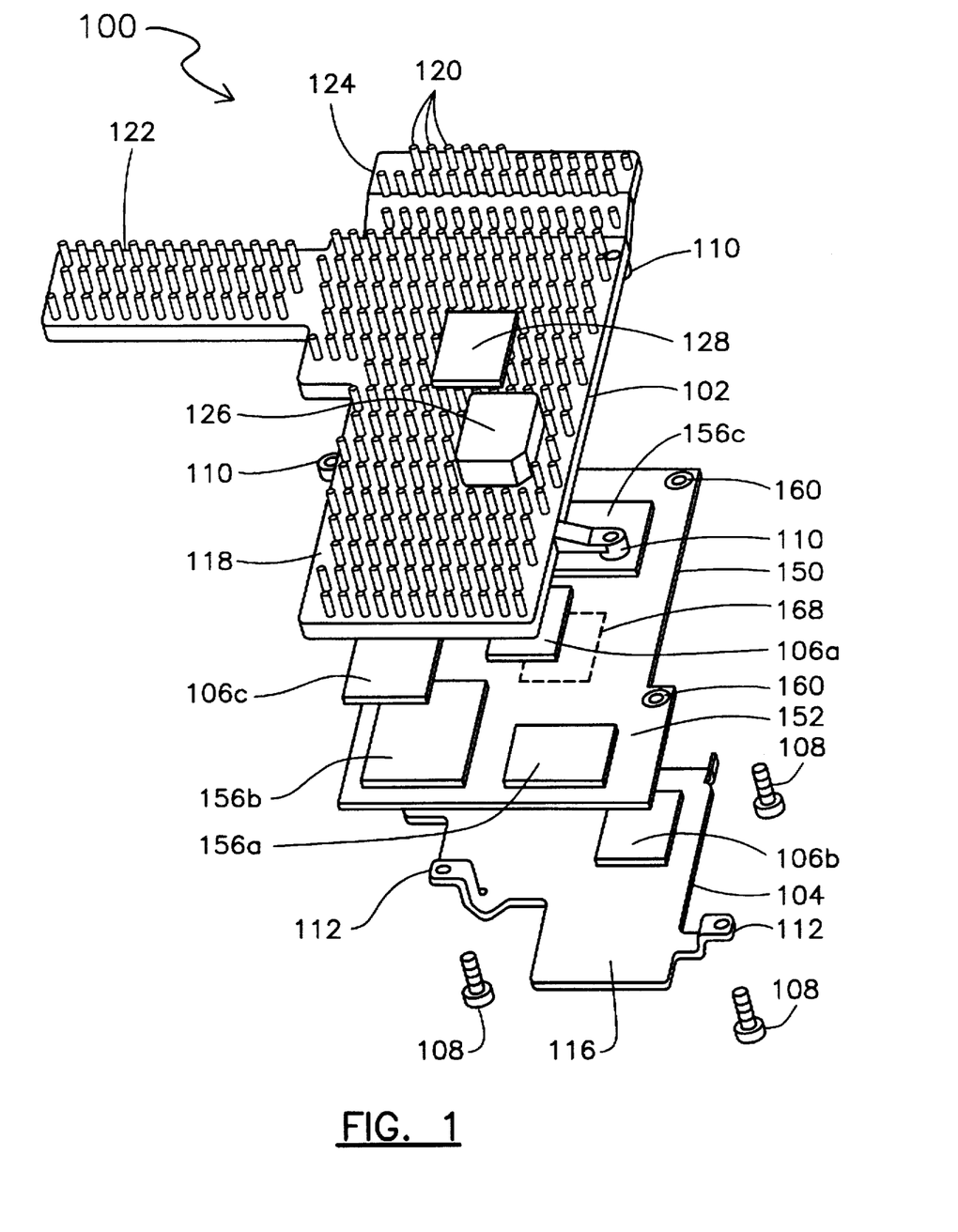
FIG. 1 is an exploded perspective view of an embodiment of the thermal management structure.
Figure 2:
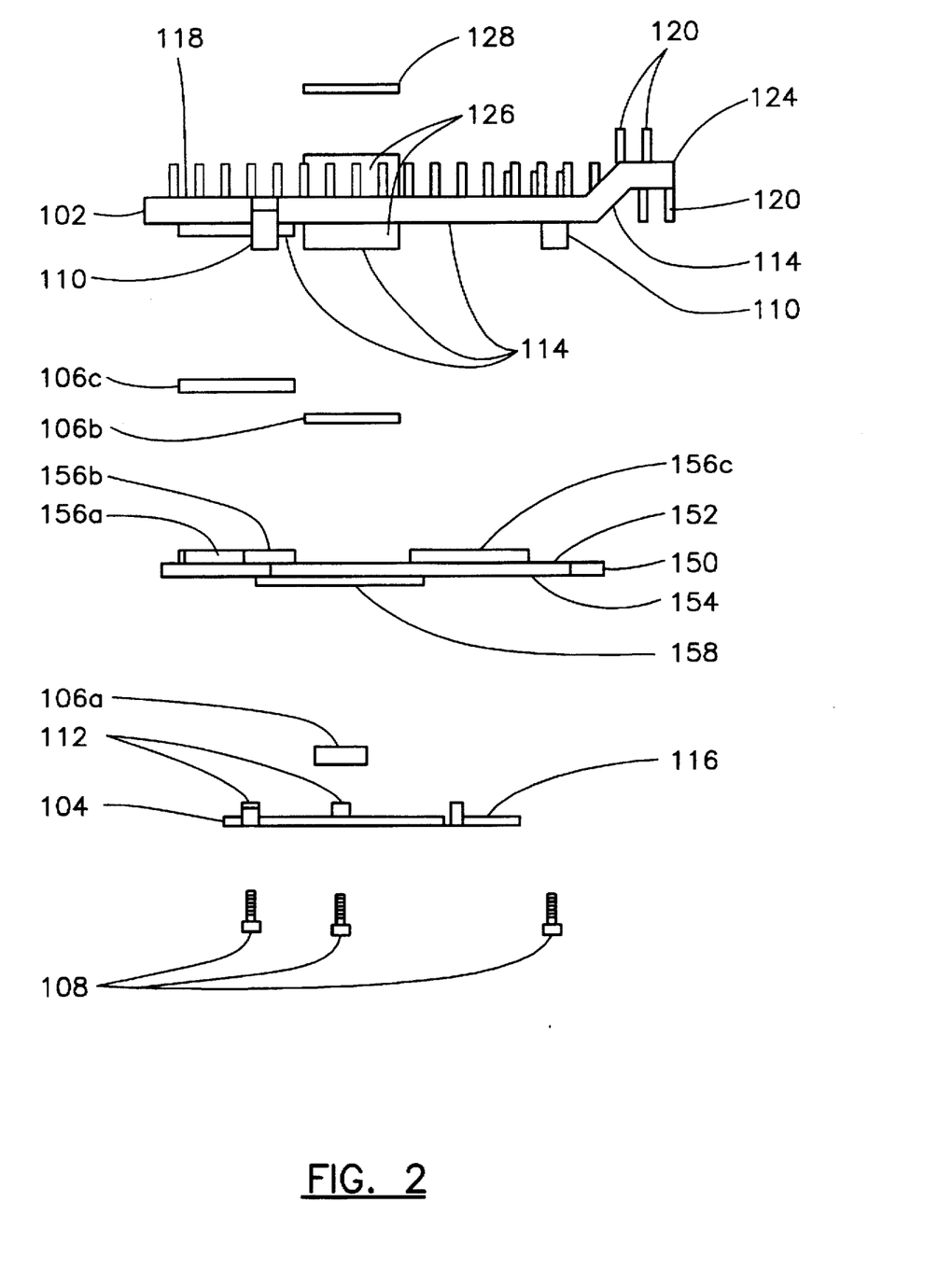
FIG. 2 is an exploded front elevation view of an embodiment of the thermal management structure.

Referring now to FIGS. 1 and 2, a thermal management structure 100 is illustrated in exploded perspective view and exploded front elevation view respectively. The thermal management structure 100 comprises four main parts: a first heat sink piece 102, a second heat sink piece 104, a plurality of thermal interface pads 106a, b and c, and a plurality of fasteners 108.

The thermal management structure 100 is in a thermal and mechanical functional cooperation with a chip-on-board substrate 150. The chip-on-board substrate 150 has a first side 152 and a second side 154, a plurality of packaged dice 156a, b and c, an unpackaged die 158 (best viewed in FIG. 2), and a plurality of mounting sites 160 (best viewed in FIG. 1). For the purpose of illustrative clarity, and not limitation, the plurality of mounting sites 160 are illustrated as holes, however, it is contemplated and with in the spirit of the present invention that some or all of the mounting sites may be holes, slots, grooves, pins or the like.

For the purpose of illustrative clarity, and not limitation, the plurality of packaged dice 156a, b and c are mounted on the first side 152 of substrate 150 and the unpackaged die 158 is mounted on the second side 154 of substrate 150 (best viewed in FIG. 2). The selection and relative positioning of unpackaged and packaged dice on a given substrate is outside the scope of the present invention. It is contemplated, however, and within the scope of the present invention, that the thermal management structure 100 may be adapted to functionally cooperate with a wide variety of unpackaged and package dice mounted on either or both sides of a substrate.

Sites on the chip-on board substrate 150 are selected which have sufficient waste heat generation so as to require thermal enhancement to remove the waste heat. It is contemplated and within the scope of the present invention, that a chip-on-board substrate may have only one site or a plurality of sites which may require thermal enhancement to remove generated waste heat. For the purpose of illustration, and not limitation, it should be assumed that the packaged die 156b and the unpackaged die 158 both generate sufficient waste heat and require thermal enhancement, whereas packaged dice 156a and c have minimal waste heat generation and do not require thermal enhancement.

Figure 2A:
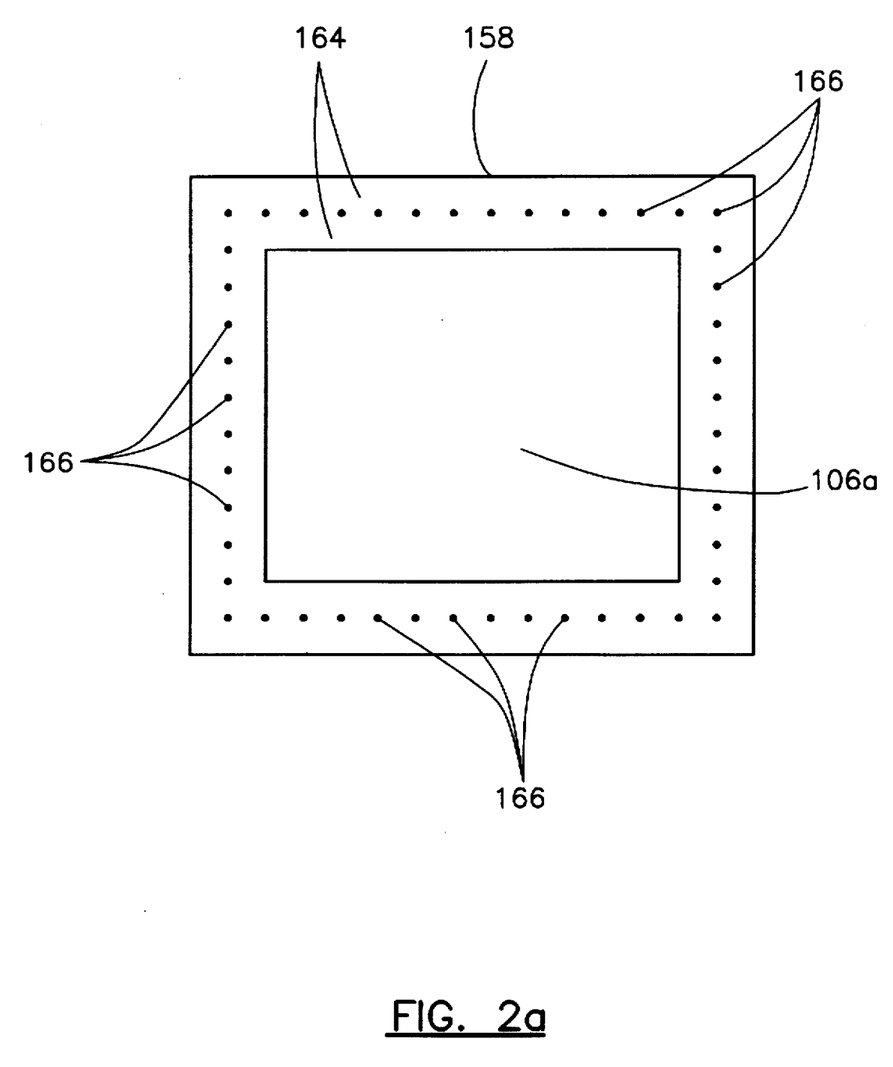
FIG. 2a is an bottom plan view of an aspect of an unpackaged die and an interface pad.
Figure 3:
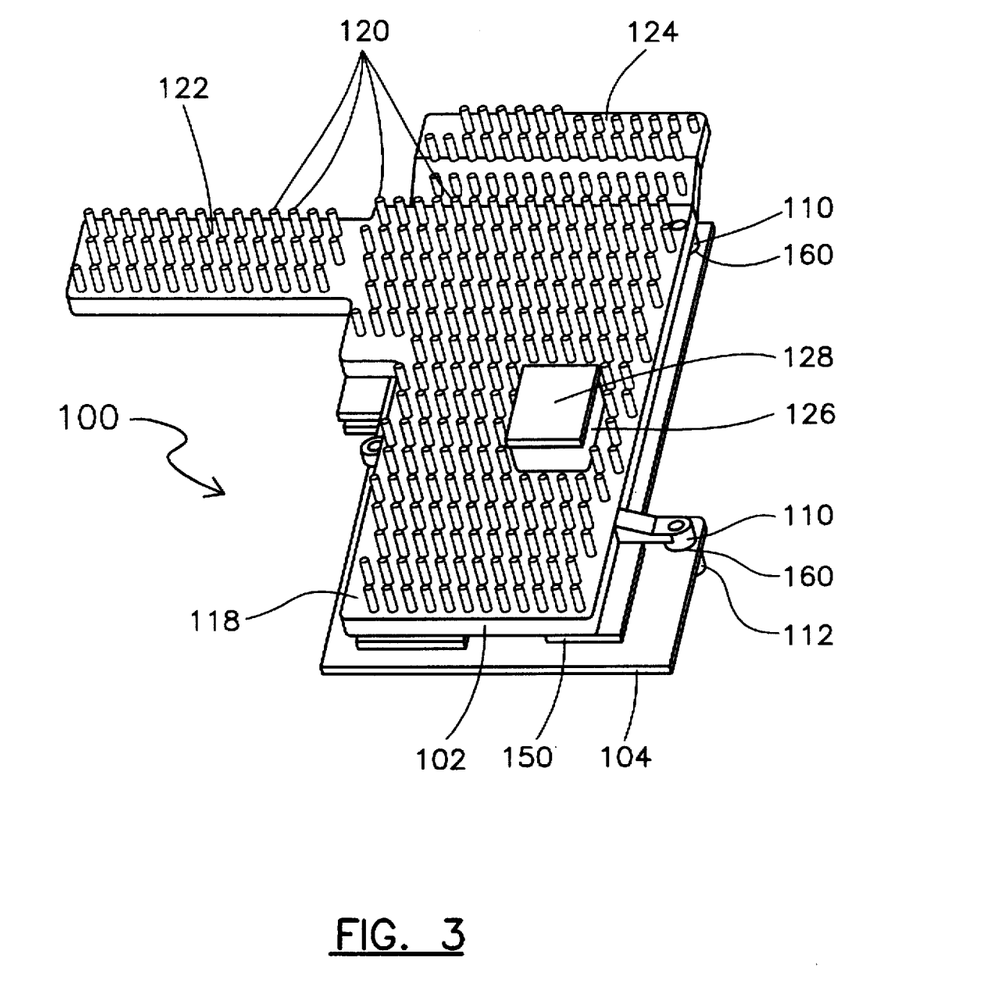
FIG. 3 is a perspective view of an embodiment of the thermal management structure.

Thermal interface pads 106a, b and c are selected and sized to engage the selected sites on the chip-on-board substrate 150 requiring thermal enhancement. Preferably the length and breadth of the thermal interface pads will be equal to or less than the corresponding length and breadth of the selected sites. If a selected site is an exposed face of a face up unpackaged chip, care should be exercised to not directly overlay or mechanically load the bond pads or electrical interconnections which typically are disposed along the outer periphery of the die, whether or not the exposed face is encapsulated. As best illustrated in FIG. 2a, a bottom plan view of the unpackaged die 158 is illustrated. Here unpackaged die 158 is in a face up configuration. The exposed face 164 has a plurality of bond pad locations 166 which are near the periphery of die 158. The interface pad 106a is centrally located and disposed on the exposed face 164 so that the interface pad 106a does not overlay or mechanically load the plurality of bond pad locations 166.

The interface pads 106a, b and c, are a mechanically compliant and thermally conductive material. Preferably the interface pads 106a, b and c are aluminum oxide filled silicone elastomer pads. It is contemplated and within the scope of the present invention, however, the interface pads 106a, b and c may be a thermally conductive grease, thermally conductive wax, thermally conductive elastomeric pad or the like, provided the interface pad is mechanically compliant and thermally conductive.

Referring again to FIGS. 1 and 2, the interface pads 106a, b, and c are interposed between the selected sites on the chip-on-board substrate 150 and either a first inside face 114 of the first heat sink piece 102 or a second inside face 116 of the second heat sink piece 104. Interface pad 106a is interposed between the exposed face 164 of unpackaged die 158 and the second inside face 116 of the second heat sink piece 104. Interface pad 106b is interposed between the "board side" of the unpackaged die 158 (i.e. the side of substrate 150 immediately opposite the side where the unpackaged die 158 is mounted), represented by the dotted line 168 in FIG. 1, and the first inside face 114 of the first heat sink piece 102. Interface pad 106c is interposed between the packaged die 156b and the first inside face 114 of the first heat sink piece 102.

The first and second heat sink pieces 102 and 104 preferably are fabricated from an aluminum alloy. It is contemplated and within the scope of the present invention, however, that the first and second heat sink pieces 102 and 104, respectively, may be fabricated from a copper alloy, a beryllium copper alloy, a beryllium aluminum alloy, a carbon fiber composite, a thermal filled plastic or any other material with good thermal conductive properties and mechanical rigidity. It is further contemplated and within the scope of the present invention that either or both the first and second heat sink pieces 102 and 104 may be fabricated by die casting, stamping, extruding, molding, injection molding, powdered metal forming or the like.

Preferably the first heat sink piece 102 is fabricated by die casting and the second heat sink piece 104 is fabricated by stamping. Most preferably the first heat sink piece 102 is fabricated from die cast Aluminum 413 Alloy and the second heat sink piece 104 is fabricated from a stamped Aluminum 1100 Alloy. It is contemplated and within the scope of the present invention, however, that the second heat sink piece 104 may be fabricated by die casting.

The first heat sink piece 102 has a plurality of first offsetting mounting brackets 110, and the second heat sink piece 104 has a plurality of second offsetting mounting brackets 112. The first plurality of offsetting mounting brackets 110 correspond and align with the plurality of mounting sites 160 on the substrate 150, which further correspond and align with the plurality of second offsetting mounting brackets 112.

Referring now to FIGS. 3, 4, 5, and 6, the thermal management structure 100 is illustrated in a perspective view, front elevation view, top plan view, and bottom plan view, respectively. Here the thermal management structure 100 is in an assembled form in functional cooperation with the chip-on-board substrate 150.

The first offsetting mounting brackets 110 align with the mounting sites 160 and rigidly engage the first side 152 of substrate 150. The second offsetting mounting brackets 112 align with the mounting sites 160 and rigidly engage the second side 154 of substrate 150. Fasteners 108 are used to fasten and firmly secure the first offsetting mounting brackets 110 to the second offsetting mounting brackets 112, thereby sandwiching the chip-on-board substrate in an unmoving relationship between the first heat sink piece 102 to the second heat sink piece 104, and also compressing the interposed interface pads 106a, b and c. By sandwiching and fixedly fastening the chip-on-board substrate 150 between the first and second heat sink pieces 102 and 103, the fragile unpackaged die 158 is mechanically isolated and therefore much less likely to be subjected to mechanical trauma during normal handling.

The fasteners 108 are preferably screws, however, it is contemplated and within the scope of the present invention that alternate fastening means may be employed, such as bolts and nuts, pins, clips, adhesives, glues, epoxies or the like.

Figure 4:
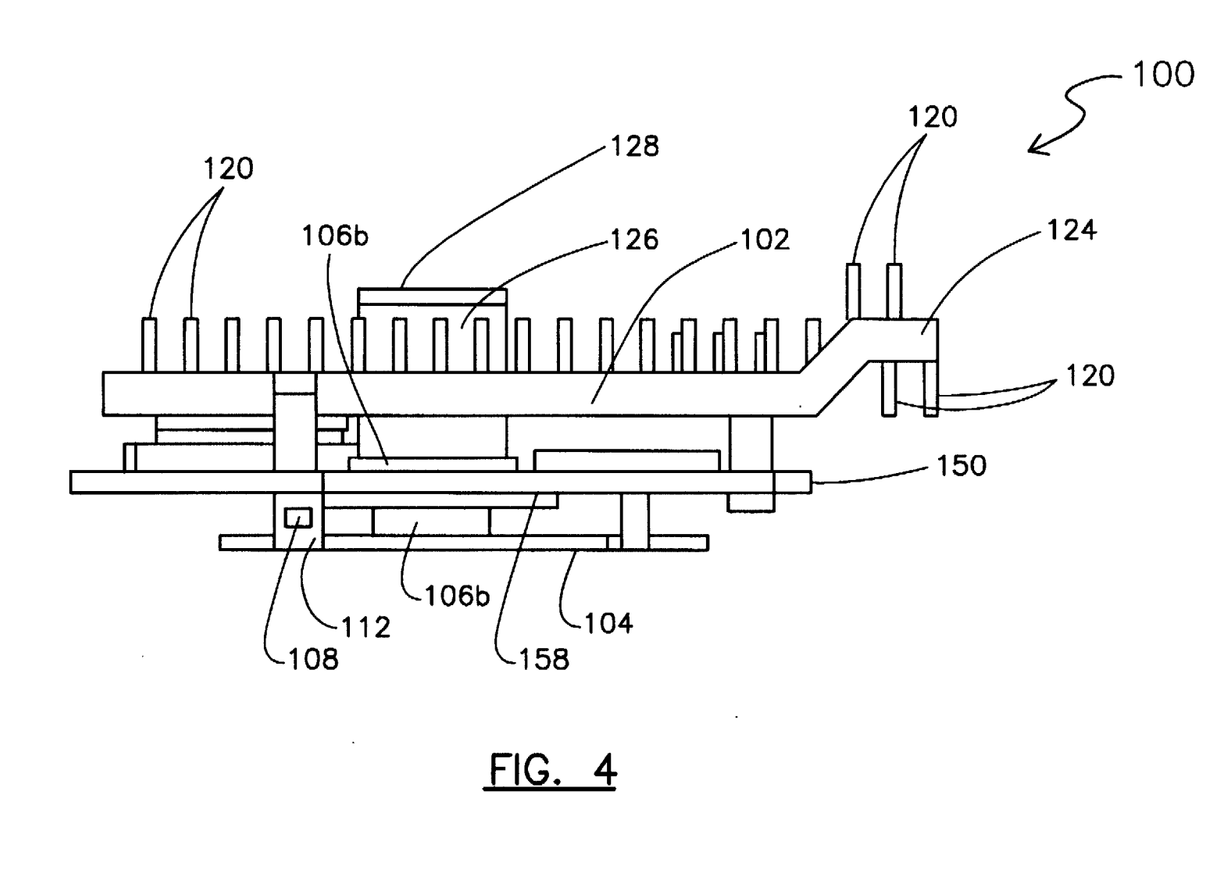
FIG. 4 is a front elevation view of an embodiment of the thermal management structure.
Figure 5:
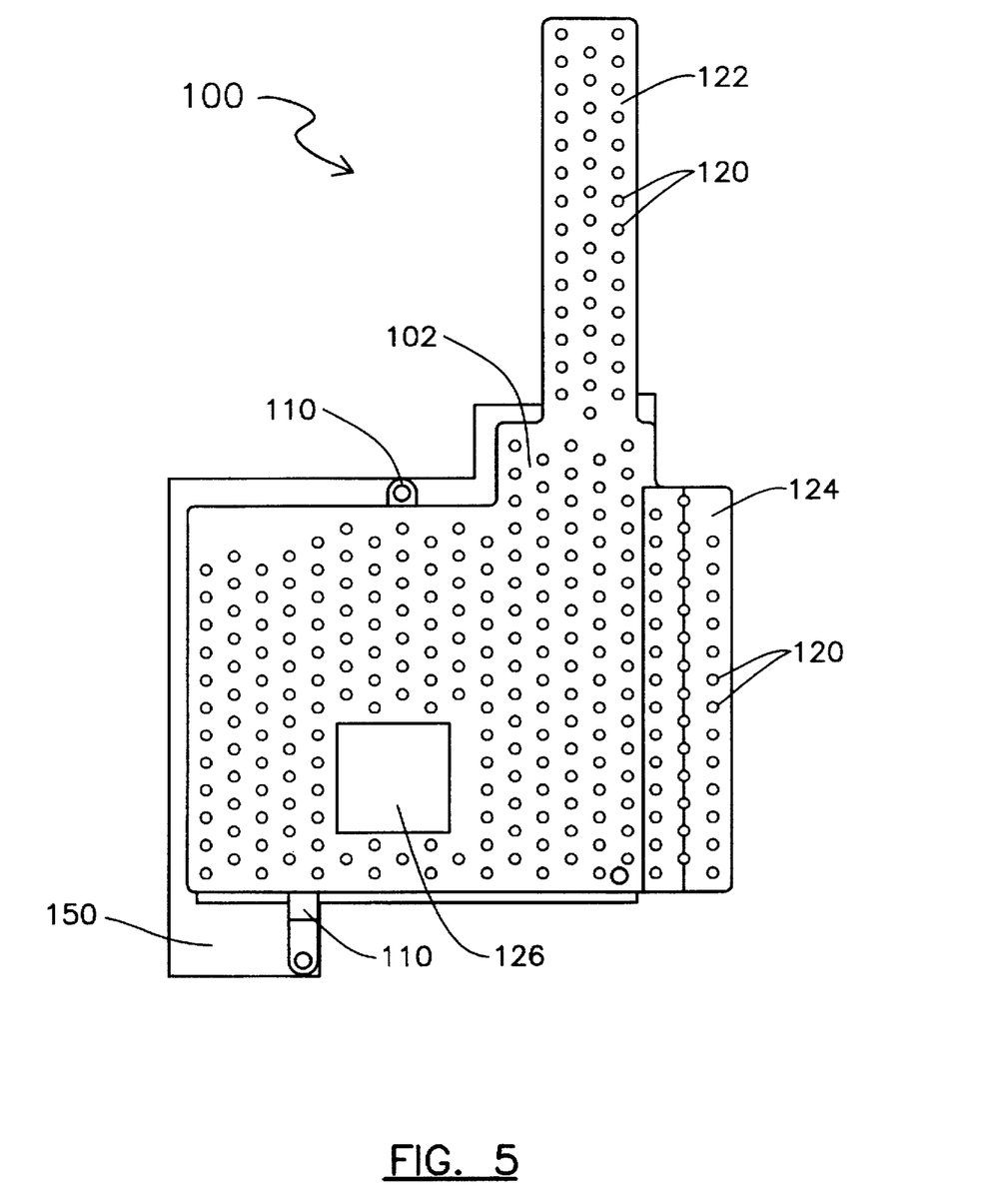
FIG. 5 is a top plan view of an embodiment of the thermal management structure.
Figure 6:
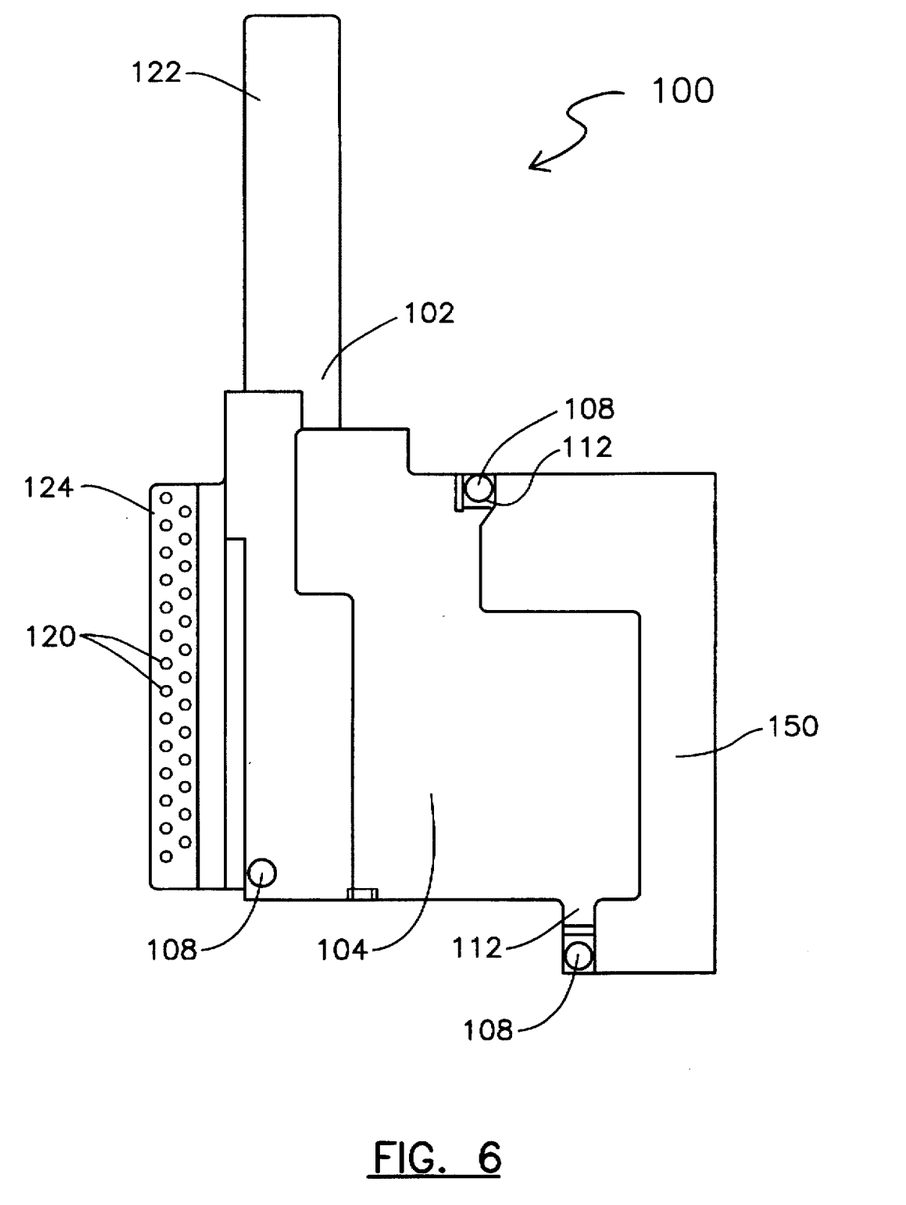
FIG. 6 is a bottom plan view of an embodiment of the thermal management structure.

As best viewed in FIG. 4, the thermal interface pad 106a compliantly engages and thermally interconnects the exposed face 164 of the unpackaged die 158 with the second heat sink piece 104. Similarly, thermal interface pad 106b compliantly engages and thermally interconnects the board side 168 of the substrate 150 with the first heat sink piece 102. Thermal interface pad 106c compliantly engages and thermally interconnects the packaged die 156b with the first heat sink piece 102.

The thicknesses of the respective interface pads 106a, b and c should each be slightly greater than the distances separating the respective surfaces which they each thermally interconnect. By so doing each interface pad will be provided with sufficient compressive force to conform the interface pad to the respective surfaces, while simultaneously not subjecting the unpackaged die 158 or substrate 150 to any damaging compressive force or deflection.

Referring to FIGS. 1, 2, 3, 4, and 5 an aspect of the present invention is illustrated. An outer face 118 of the first heat sink piece 102 is selectively populated with a plurality of extended surfaces 120 which are thermally conductive. The plurality of extended surfaces 120 increase the surface area to mass ratio, thereby increasing the convective and radiant transfer of heat to the ambient environment. Preferably the plurality of extended surfaces 120 are pins, and most preferably are cylindrical pins. It is contemplated and within the scope of the present invention, however, that the plurality of extended surfaces 120 may be ribs or pins, and the pins may have a non-circular cross-section (i.e. non-cylindrical) such as elliptical, rectangular, square or the like. It is contemplated and within the scope of the present invention that a plurality of extended surfaces may be selectively located on either, both, or neither the first heat sink piece 102 and/or the second heat sink piece 104.

Another aspect of the present invention is that the first heat sink piece 102 and the second heat sink piece 104 can each be shaped and sized independent of each other to conform to the space available in a specific end product while providing heat conduction pathways to cooler distant points in the end product. For the purposes of illustration, and not limitation, the first heat sink piece 102 has a first projection 122 which extends the heat sink mass in the plane of the first heat sink piece 102 (best viewed in FIGS. 1, 3, 5 and 6) and a second projection 124 which extends the heat sink mass out of the plane of the first heat sink piece 102 (best viewed in FIGS. 1, 2, 3 and 4).

It is further contemplated and within the scope of the present invention that a plurality of extended surfaces may be selectively located on the inside face of one or more projections extending from either the first heat sink piece 102 or the second heat sink piece 104. For example, referring to FIGS. 4 and 6, a plurality of extended surfaces 120 are selectively located on the first inside face 114 on the second projection 124 of the first heat sink piece 102.

The first heat sink piece 102 may have a thermal mass block 126 (best viewed in FIGS. 1, 2, 3, 4 and 5) which is located proximate to the board side 168 of the unpackaged die 158, and which also projects out of the plane of the first heat sink piece 102. The thermal mass block 126 provides a large cross-sectional area to conductively remove heat from the unpackaged die 158 to a supplemental thermal enhancement (not illustrated). The thermal mass block may be thermally connected to the supplemental thermal enhancement by using a mechanically compliant and thermally conductive external interface pad 128, such as a aluminum oxide filled silicone elastomer pad, or other thermal conductive interface means such as, but not limited to: thermally conductive grease, thermally conductive wax, thermally conductive epoxy, thermally conductive screws or the like.

Figure 7:
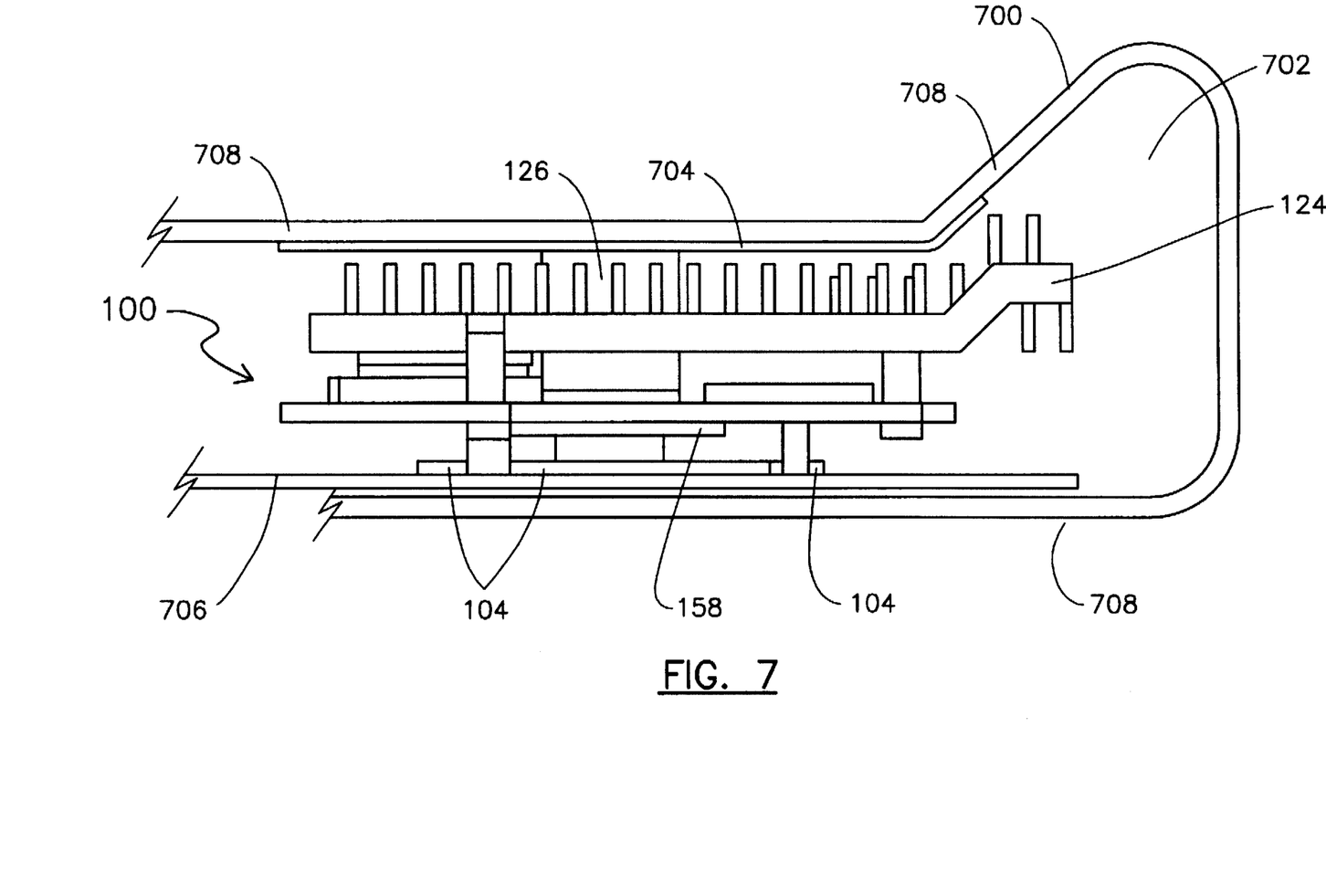
FIG. 7 is a front elevation view of an embodiment of the thermal management structure.

Referring now to FIG. 7 the thermal management structure 100 is illustrated in a front elevation view inside an end product 700 (partially illustrated). The end product 700 has a plurality of electrical terminals and signal terminals (not illustrated) which are interconnected (not illustrated) to the chip-on-board substrate 150 and a chassis 708 for receiving and containing the thermal management structure 100. The end product 700 could be one of a number of end products which use semiconductor devices, including, but not limited to: a personal digital assistant, a lap top computer, a notebook computer, a sub-notebook computer, a desktop computer, a printer, a scanner, a modem or the like.

As discussed above a projection, such as the second projection 124, can be used to extend the heat sink mass into an available space 702 of the end product. Also as discussed above, the thermal mass block 126 may be thermally connected to a supplemental thermal enhancement. Here, a thermally conductive first end product component 704 may be thermally connected to the thermal mass block 126. The first end product component 704 is used to further conductively spread heat to distant points within the end product 700. Similarly, the second heat sink piece 104 may be thermally connected to a thermally conductive second end product component 706, also used to further conductively spread heat to other distant points within the end product 700. The first and second end product components 704 and 706 may be any end product component which will not be damaged by the conducted heat, such as, but not limited to: a chassis, frame, superstructure, case or the like.

The present invention, therefore, is well adapted to carry out the objects and attain the ends and advantages mentioned, as well as others inherent therein. While presently preferred embodiments of the invention and various aspects thereto have been given for purposes of disclosure, numerous changes in the details of construction, interconnection and arrangement of parts will readily suggest themselves to those skilled in the art and which are encompassed within the spirit of the invention and the scope of the appended claims.

While the present invention has been depicted, described, and is defined by reference to particularly preferred embodiments of the invention, such references do not imply a limitation on the invention, and no such limitation is to be inferred. The invention is capable of considerable modification, alternation, and equivalents in form and function, as will occur to those ordinarily skilled in the pertinent arts. The depicted and described preferred embodiments of the invention are exemplary only, and are not exhaustive of the scope of the invention. Consequently, the invention is intended to be limited only by the spirit and scope of the appended claims, giving full cognizance to equivalents in all respects.

What is claimed is:

1. A thermal management structure for a chip-on-board substrate, the thermal management structure comprising:

a substrate having a first side, a second side, an unpackaged semiconductor die mounted on the second side, the unpackaged semiconductor die having an exposed face;

a first heat sink piece having a first face and a first plurality of mounting brackets, the first face proximate to the first side of said substrate and the first plurality of mounting brackets rigidly engaging the first side of said substrate;

a second heat sink piece having a second face and a second plurality of mounting brackets, the second face proximate to the exposed face of the unpackaged semiconductor die mounted on the second side of said substrate and the second plurality of mounting brackets rigidly engaging the second side of said substrate;

a first interface means interposed between and compliantly engaging the first side of said substrate and the first face of said first heat sink piece, the first interface means proximate to the unpackaged semiconductor die whereby the first interface means conductively transfers heat from the unpackaged semiconductor die to said first heat sink piece;

a second interface means interposed between and compliantly engaging the exposed face of the unpackaged semiconductor die and the second face of said second heat sink piece whereby the second interface means conductively transfers heat from the unpackaged semiconductor die to said second heat sink piece; and a plurality of fasteners, said fasteners fixedly connecting the first plurality of mounting brackets to the second plurality of mounting brackets.

2. The thermal management structure according to claim 1, wherein said first interface means is a first interface pad.

3. The thermal management structure according to claim 1, wherein said second interface means is a second interface pad.

4. The thermal management structure according to claim 1, wherein said first interface means is a first aluminum oxide filled silicone elastomeric pad.

5. The thermal management structure according to claim 1, wherein said second interface means is a second aluminum oxide filled silicone elastomeric pad.

6. The thermal management structure according to claim 1, wherein said first interface means is a thermally conductive wax.

7. The thermal management structure according to claim 1, wherein said second interface means is a thermally conductive wax.

8. The thermal management structure according to claim 1, wherein said first interface means is a thermally conductive grease.

9. The thermal management structure according to claim 1, wherein said first heat sink piece is an aluminum alloy and said second heat sink piece is an aluminum alloy.

10. The thermal management structure according to claim 1, wherein said first heat sink piece is a copper alloy and said second heat sink piece is a copper alloy.

11. The thermal management structure according to claim 1, wherein said first heat sink piece is a carbon fiber composite and said second heat sink piece is a carbon fiber composite.

12. The thermal management structure according to claim 1, wherein said first heat sink piece is a thermal filled plastic and said second heat sink piece is a thermal filled plastic.

13. The thermal management structure according to claim 1, wherein said first heat sink piece is die cast.

14. The thermal management structure according to claim 1, wherein said first heat sink piece is stamped.

15. The thermal management structure according to claim 1, wherein said second heat sink piece is die cast.

16. The thermal management structure according to claim 1, wherein said second heat sink piece is stamped.

17. The thermal management structure according to claim 1, further comprising:
an end product component, said end product component having an attachment surface; and
said second heat sink piece having an outer face, the outer face thermally engaging the attachment surface of said end product component, whereby heat is conducted from a thermal mass block to said end product component.

18. The thermal management structure according to claim 1, wherein said first heat sink piece having an outer face and a thermal mass block, the thermal mass block projecting out of the outer face.

19. The thermal management structure according to claim 18, further comprising:
an end product component, said end product component having an attachment surface; and
the outer face of said first heat sink piece is proximate to said end product component, and the thermal mass block of said first heat sink piece thermally connected to the attachment surface of said end product component, whereby heat is conducted from the thermal mass block to said end product component.

20. The thermal management structure according to claim 19, wherein said end product component is a chassis.

21. The thermal management structure according to claim 1, wherein said first heat sink piece having a plurality of extended surfaces.

22. The thermal management structure according to claim 21, wherein the plurality of extended surfaces are a plurality of pins.

23. The thermal management structure according to claim 22, wherein the plurality of pins are cylindrical.

24. A method of mechanically isolating and thermally managing a chip-on-board substrate, comprising the steps
providing a chip-on-board substrate having a first side, a second side, an unpackaged semiconductor die mounted on the second side, the unpackaged semiconductor die having an exposed face;
providing a first heat sink piece having a first face and a first plurality of mounting brackets;
providing a second heat sink piece having a second face and a second plurality of mounting brackets;
interposing a first thermally conductive interface between the first side of the substrate and the first face of the first heat sink piece;
compressively engaging the first thermally conductive interface between the first side of the substrate and the first face of the first heat sink piece;
rigidly engaging the first plurality of mounting brackets of the first heat sink piece with the first side of said substrate;
interposing a second thermally conductive interface between the exposed face of the unpackaged semiconductor die and the second face of the second heat sink piece;
compressively engaging the second thermally conductive interface between the exposed face of the unpackaged semiconductor die and the second face of the second heat sink piece;
rigidly engaging the second plurality of mounting brackets of the second heat sink piece with the second side of said substrate; and
connecting the first plurality of mounting brackets to the second plurality of mounting brackets, thereby forming a single module semiconductor device.

25. The method of claim 24, further comprising the steps of:
providing an end product;
handling the single module semiconductor device; and
installing the single module semiconductor device in the end product.

26. The method of claim 25, further comprising the step of:
operating the single module semiconductor device in the end product.

27. The method of claim 25, further comprising the step of:
thermally connecting the first heat sink piece to the end product.

28. The method of claim 25, further comprising the step of:
thermally connecting the second heat sink piece to the end product.

29. An electronic system having thermal management and mechanical isolation of a chip-on-board substrate, said electronic system comprising:
a chip-on-board substrate having a first side, a second side, an unpackaged semiconductor die mounted on the second side, the unpackaged semiconductor die having an exposed face;
a first heat sink piece having a first face and a first plurality of mounting brackets, the first face proximate to the first side of said substrate and the first plurality of mounting brackets rigidly engaging the first side of said substrate;

a second heat sink piece having a second face and a second plurality of mounting brackets, the second face proximate to the exposed face of the unpackaged semiconductor die mounted on the second side of said substrate and the second plurality of mounting brackets rigidly engaging the second side of said substrate;

a first interface means interposed between and compliantly engaging the first side of said substrate and the first face of said first heat sink piece, the first interface means proximate to the unpackaged semiconductor die whereby the first interface means conductively transfers heat from the unpackaged semiconductor die to said first heat sink piece;

a second interface means interposed between and compliantly engaging the exposed face of the unpackaged semiconductor die and the second face of said second heat sink piece whereby the second interface means conductively transfers heat from the unpackaged semiconductors die to said second heat sink piece;

a plurality of fasteners, said fasteners fixedly connecting the first plurality of mounting brackets to the second plurality of mounting brackets, thereby forming a thermal management structure; and said electronic system having a plurality of electrical terminals, signal terminals and a chassis, the plurality of electrical terminals interconnected to the chip-on-board substrate, the plurality of signal terminals interconnected to the chip-on-board substrate, and the chassis containing the thermal management structure.

30. The system of claim 29, wherein said electronic system has a plurality of electronic components, at least one of the plurality of electronic components being, thermally connected to the thermal management structure, whereby heat is conductively transferred from the thermal management structure to heat dissipating areas within the electronic system.

31. The system of claim 29, wherein said electronic system has a plurality of electronic components, at least one of the plurality of electronic components being thermally connected to the first heat sink piece, whereby heat is conductively transferred from the first heat sink piece to heat dissipating areas within the electronic system.

32. The system of claim 29, wherein said electronic system has a plurality of electronic components, at least one of the plurality of electronic components being thermally connected to the second heat sink piece, whereby heat is conductively transferred from the second heat sink piece to heat dissipating areas within the electronic system.

33. The system of claim 29, wherein said electronic system is a personal digital assistant.

34. The system of claim 29, wherein said electronic system is a lap top computer.

35. The system of claim 29, wherein said electronic system is a notebook computer.

36. The system of claim 29, wherein said electronic system is a sub-notebook computer.

37. The system of claim 29, wherein said electronic system is a desktop computer.

38. The system of claim 29, wherein said electronic system is a printer.

39. The system of claim 29, wherein said electronic system is a scanner.

40. The system of claim 29, wherein said electronic system is a modem.

41. A computer system having thermal management and mechanical isolation of a chip-on-board substrate, said computer system comprising:

a chip-on-board substrate having a first side, a second side, an unpackaged microprocessor die mounted on the second side, the unpackaged microprocessor die having an exposed face;

a first heat sink piece having a first face and a first plurality of mounting brackets, the first face proximate to the first side of said substrate and the first plurality of mounting brackets rigidly engaging the first side of said substrate;

a second heat sink piece having a second face and a second plurality of mounting brackets, the second face proximate to the exposed face of the unpackaged microprocessor die mounted on the second side of said substrate and the second plurality of mounting brackets rigidly engaging the second side of said substrate;

a first interface means interposed between and compliantly engaging the first side of said substrate and the first face of said first heat sink piece, the first interface means proximate to the unpackaged microprocessor die whereby the first interface means conductively transfers heat from the unpackaged microprocessor die to said first heat sink piece;

a second interface means interposed between and compliantly engaging the exposed face of the unpackaged microprocessor die and the second face of said second heat sink piece whereby the second interface means conductively transfers heat from the unpackaged microprocessor die to said second heat sink piece;

a plurality of fasteners, said fasteners fixedly connecting the first plurality of mounting brackets to the second plurality of mounting brackets, thereby forming a thermal managements structure; and said computer system having a plurality of electrical terminals, signal terminals and a chassis, the plurality of electrical terminals interconnected to the chip-on-board substrate, the plurality of signal terminals interconnected to the chip on-board substrate, and the chassis containing the thermal management structure.

* * * * *